(12) United States Patent
Tsuboi

(10) Patent No.: US 6,413,841 B1
(45) Date of Patent: Jul. 2, 2002

(54) MOS TYPE SEMICONDUCTOR DEVICE AND MANUFACTURING METHOD THEREOF

(75) Inventor: Atsushi Tsuboi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/422,193

(22) Filed: Oct. 21, 1999

(30) Foreign Application Priority Data

Oct. 22, 1998 (JP) .......................................... 10-300838

(51) Int. Cl.[7] .......................... H01L 21/20; H01L 21/36; H01L 21/3205; H01L 21/4763
(52) U.S. Cl. ...................... 438/486; 438/593; 438/590; 438/652; 438/489; 438/592; 257/51; 257/64
(58) Field of Search ................................. 438/592, 593, 438/2, 3, 590, 652, 489, 486, FOR 193, FOR 269; 257/51, 64

(56) References Cited

U.S. PATENT DOCUMENTS 6,194,267 B1 * 2/2001 Kaya .......................... 438/257

FOREIGN PATENT DOCUMENTS

| JP | 47-41265 | 12/1972 | |
|---|---|---|---|
| JP | 58-201367 | 11/1983 | |
| JP | 62-35555 | 2/1987 | |
| JP | 1-173713 | 7/1989 | |
| JP | 2-140853 | 5/1990 | |
| JP | 2-298074 | 12/1990 | |
| JP | 404035019 A * | 2/1992 | ........ 438/FOR 269 |
| JP | 4-287929 | 10/1992 | |
| JP | 5-102466 | 4/1993 | |

* cited by examiner

Primary Examiner—George Fourson
Assistant Examiner—Neal Berezny

(57) ABSTRACT

First, a polysilicon film is formed on a gate oxide film. Next, a polysilicon oxide film is formed on the polysilicon film. Thereafter, the polysilicon film is thermally treated to allow a crystal grain in the polysilicon film to grow from the gate oxide film and the polysilicon oxide film. In a MOS type semiconductor device manufactured in this manner has a gate electrode formed of a plurality of laminated polycrystalline silicon layers each having substantially a single crystal grain in a thickness direction of the gate electrode.

7 Claims, 4 Drawing Sheets

NMOS    PMOS

MOS TYPE SEMICONDUCTOR DEVICE AND MANUFACTURING METHOD THEREOF

BACKGROUND OF THE INVENTION

1. Field of the Invention

The present invention relates to a MOS type semiconductor device and a manufacturing method thereof, and more particularly, to a MOS type semiconductor device and a manufacturing method thereof capable of preventing ion from passing through a gate electrode at the time of ion implantation for forming a source region and a drain region.

2. Description of the Related Art

In a manufacturing method of a MOS type semiconductor device, if ion passes through a gate electrode at the time of ion implantation for forming a source region and a drain region, the ion reaches a gate oxide film and a channel portion of the transistor under the gate electrode. As a result, a threshold value of the transistor varies. Therefore, the transistor can not operate normally, and the semiconductor device does not function. For this reason, it is necessary to prevent ion from passing through the gate electrode at the time of ion implantation.

Conventionally, the thickness of a polysilicon film of a gate electrode is sufficiently increased so as to prevent the ion from passing through the gate electrode at the time of the ion implantation. However, according to this method, it is necessary to form a $P^+$-polysilicon region by ion implantation as in a P-N gate system in which P-type polysilicon is applied to a P-channel MOS transistor. Therefore, even if it is necessary to prevent depletion in the gate electrode, the thickness of the gate polysilicon film can not be reduced. In consequence, there is a problem that it is not possible to prevent ion from passing through the gate electrode.

Thereupon, a method, for example, disclosed in Japanese Patent Application Laid-open No. Hei 4-287929 is used. If grain size in the polysilicon film is small, ion can not pass through the gate electrode easily. This method prevents the grain size of polysilicon from being increased, thereby preventing the ion from passing through the gate electrode. FIG. 1 is a sectional view showing a gate electrode of a semiconductor device disclosed in Japanese Patent Application Laid-open No. Hei 4-287929.

As shown in FIG. 1, a polysilicon film 106 as a gate electrode is formed on a gate oxide film 105 and then, oxygen ions are implanted, thereby making a surface of the polysilicon film 106 into an amorphous state. As a result silicon region 107 is formed there. At the same time, the polysilicon film 106 includes many oxygen ions, which prevent the grain size from growing.

In this manner, by implanting the oxygen ions, the polysilicon is made into amorphous state, and the implanted oxygen ions prevent the grain size from growing. Therefore, it is possible to prevent the ion from passing through the gate electrode.

However, in order to increase the thickness of the layer having many oxygen ions in the polysilicon film 106 at the time of ion implantation for forming a source region and a drain region, it is necessary to implant the oxygen ions up to a portion close to the gate oxide film 105. Therefore, there is a problem that the gate oxide film 105 is damaged by the ion implantation.

SUMMARY OF THE INVENTION

It is an object of the present invention to provide a MOS type semiconductor device and a manufacturing method thereof capable of preventing ion from passing through a gate electrode at the time of ion implantation for forming a source region and a drain region, such that a gate oxide film is not damaged by ion implantation.

According to one aspect of the present invention, a MOS type semiconductor device comprises a gate electrode comprising a plurality of laminated polycrystalline silicon layers each having a substantially single grain in a thickness direction of the gate electrode.

A polysilicon oxide film may be formed between the polycrystal silicon layers.

According to another aspect of the present invention, a manufacturing method of a MOS type semiconductor device comprises the steps of: forming a polysilicon film on a gate oxide film; forming a polysilicon oxide film on the polysilicon film; and heating the polysilicon film to allow crystal grain in the polysilicon film to grow from the gate oxide film and the polysilicon oxide film.

The step of forming the polysilicon oxide film may include a step of annealing the polysilicon film in oxygen atmosphere. The step of heating the polysilicon film may include a step of annealing the polysilicon film in nitrogen atmosphere.

According to another aspect of the present invention, a manufacturing method of a MOS type semiconductor device comprises a step of forming (N+1) layers (N is a natural number) of polysilicon films and N layers of polysilicon oxide films on a gate oxide film such that the polysilicon films and the polysilicon oxide films are alternately laminated on one another.

In the present invention, since the gate electrode is formed of two or more laminated polycrystalline grain layers each comprising a substantially single grain in the thickness direction, a grain boundary is formed in the gate electrode in its thickness direction. Therefore, it is possible to prevent the ion from passing through the gate electrode during the ion implantation process for formation a source region and a drain region.

BRIEF DESCRIPTION OF THE PREFERRED EMBODIMENTS

Figure 1:
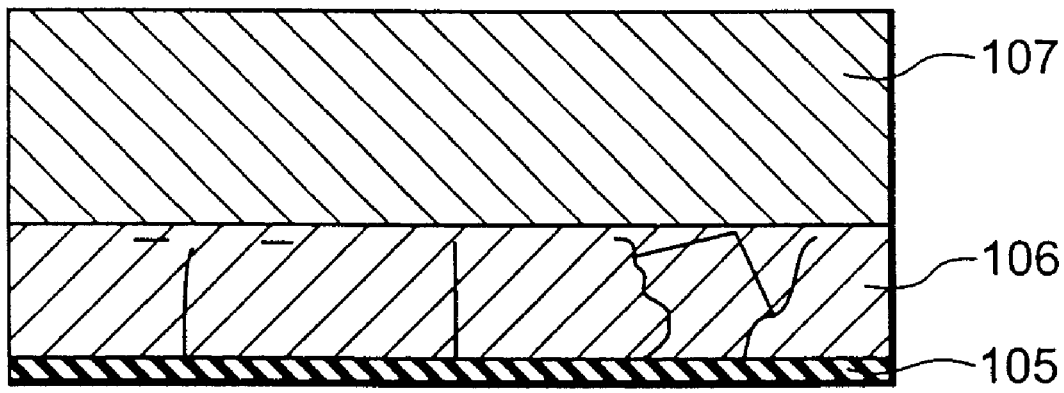
FIG. 1 is a sectional view showing a gate electrode of a semiconductor device which has been disclosed in Japanese Patent Application Laid-open No. Hei 4-287929.
Figure 2:
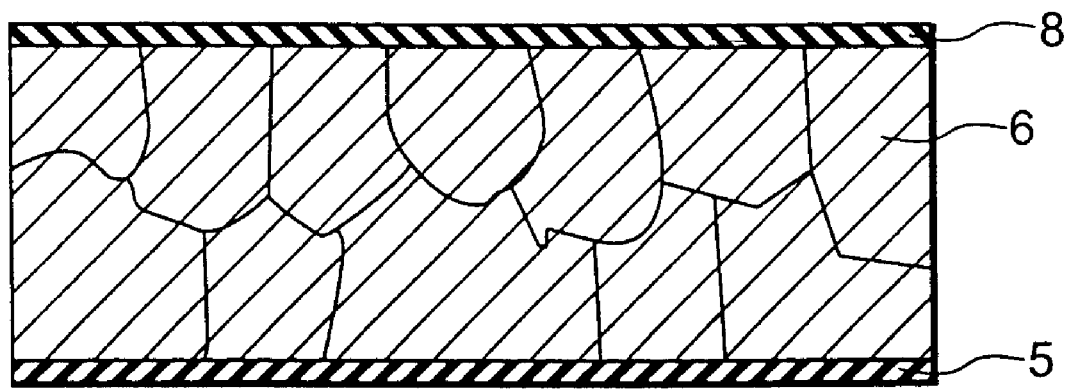
FIG. 2 is a sectional view showing a gate electrode of a MOS type semiconductor device according to a first embodiment of the present invention.

A MOS type semiconductor device and a manufacturing method thereof according to a first embodiment of the present invention will be explained specifically with reference to the accompanying drawings below. FIG. 2 is a sectional view showing a gate electrode of a MOS type semiconductor device according to a first embodiment of the present invention. FIGS. 3A to 3D are sectional views taken along line A—A (refer to FIG. 4) showing manufacturing method of the MOS semiconductor device according to the first embodiment of the present invention in the order of steps. FIG. 4 is a plan view showing an N-channel MOS transistor and a P-channel MOS transistor formed on a silicon substrate of the MOS semiconductor device according to the first embodiment of the present invention.

As shown in FIG. 2, a gate electrode of a MOS type semiconductor device according to the first embodiment of the present invention has a polysilicon film 6 formed on a gate oxide film 5. A polysilicon oxide film 8 is formed on the polysilicon film 6. The polysilicon film 6 comprises two laminated polycrystalline grain layers. Each of the polycrystalline grain layers comprises a substantially single crystal grain in a thickness direction of the polysilicon film 6.

A manufacturing method of the MOS type semiconductor device according to the first embodiment of the invention will be explained in the order of steps.

Figure 3A:
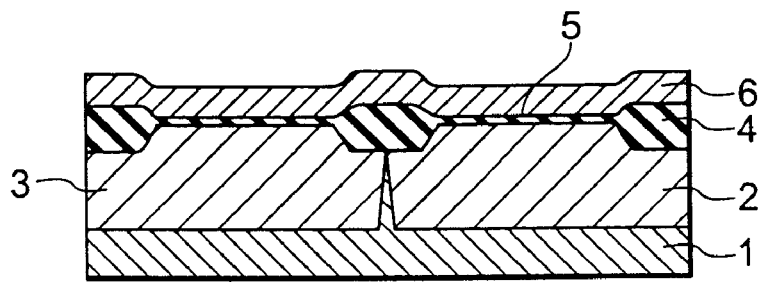
FIGS. 3A to 3D are sectional views taken along the line A—A (refer to FIG. 4) showing manufacturing method of the MOS semiconductor device according to the first embodiment of the present invention in the order of steps.
Figure 4:
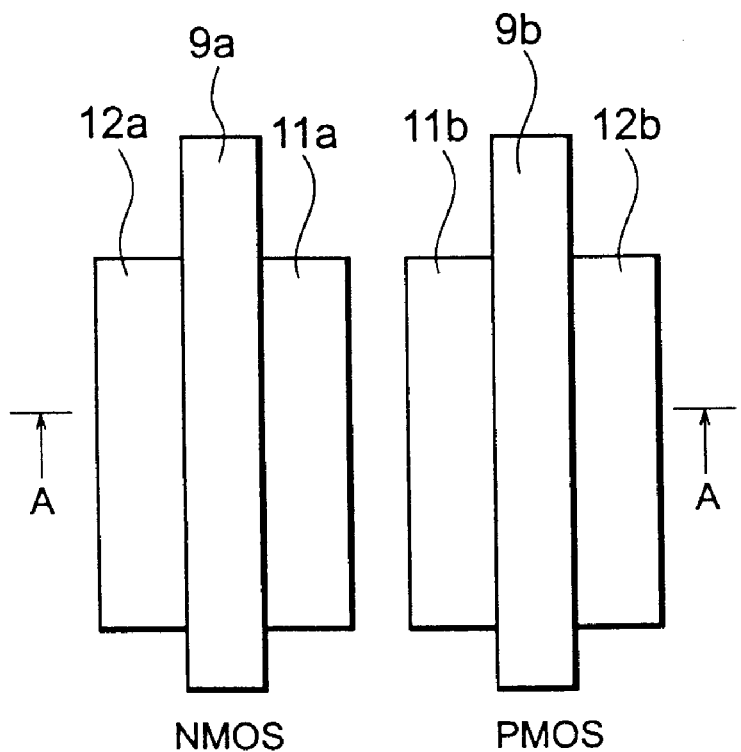
FIG. 4 is a plan view showing an N-channel MOS transistor and a P-channel MOS transistor formed on a silicon substrate of the MOS semiconductor device of the first embodiment of the present invention.

In the present embodiment, as shown in FIG. 3A, first, a P-well 3 is formed in an N-channel MOS transistor forming region of a silicon substrate 1, and an N-well 2 is formed in a P-channel MOS transistor forming region of the silicon substrate 1. At this time, surfaces of the P-well 3 and the N-well 2 are substantially flush with each other. Element separation regions 4 are formed on upper end surfaces of the P-well 3 and the N-well 2, and a gate oxide film 5 is formed thereon, and a gate polysilicon film 6 is formed on the gate oxide film 5.

Figure 3B:
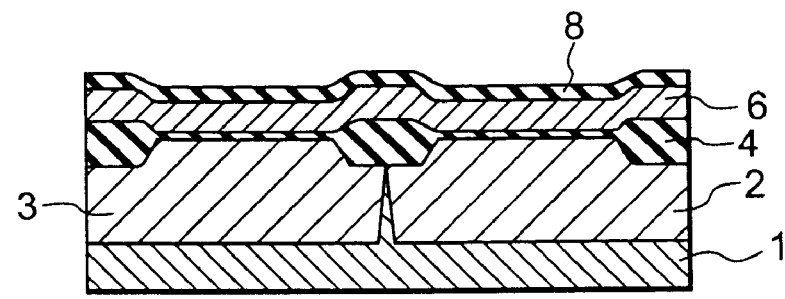

Next, as shown in FIG. 3B, a rapid thermal anneal (short-time thermal treatment, which will be referred to as "RTA" hereinafter) at a temperature of about 900° C., for example, in oxygen atmosphere is carried out to form a polysilicon oxide film 8 on the gate polysilicon film 6 at a thickness of about 100 Å, for example. Further, another RTA is carried out at a temperature of about 900° C., for example, in nitrogen atmosphere for crystallizing the gate polysilicon film 6 to allow the gate polysilicon film 6 to grow its grain size.

At that time, since each of the gate oxide film 5 and the polysilicon oxide film 8 functions as a seed of crystal for the gate polysilicon film 6 to crystallize, the grain of the polysilicon grows from the gate oxide film 5 and the polysilicon oxide film 8. Thus, the gate polysilicon film 6 are formed of two laminated polycrystal grain layers each comprising a substantially single grain in its thickness direction as shown in FIG. 2.

Figure 3C:
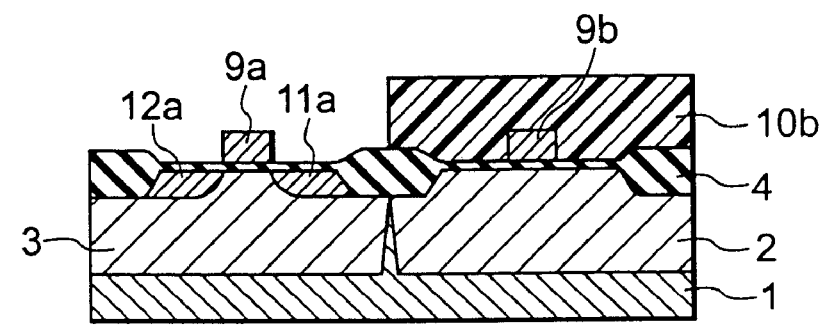

Thereafter, as shown in FIG. 3C, the gate polysilicon film 6 is subjected to lithography and dry etching, thereby forming a gate electrode 9a of the N-channel MOS transistor above the P-well 3, and forming a gate electrode 9b of the P-channel MOS transistor above the N-well 2. An upper portion of the N-well 2 is masked with a photoresist 10b, and N-type ions are implanted into the P-well 3, thereby forming a source region 11a and a drain region 12a of the N-channel MOS transistor.

Figure 3D:
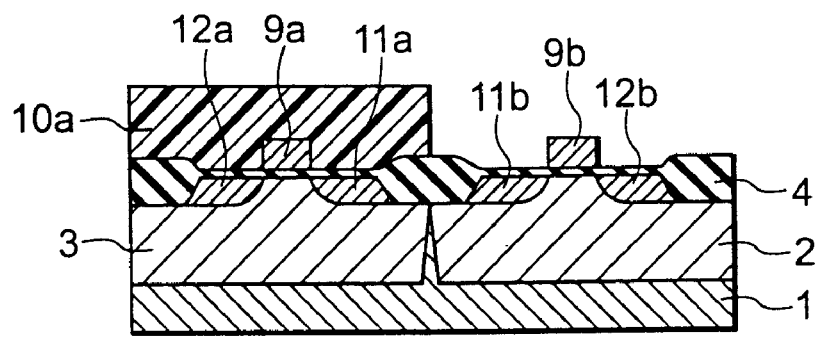

Next, as shown in FIG. 3D, the photoresist 10b is peeled off and then, an upper portion of the P-well 3 is masked with the photoresist 10a, and P-type ions are implanted into the N-well 2, thereby forming a source region 11b and a drain region 12b of the P-channel MOS transistor. Then, the photoresist 10a is peeled off.

If the MOS type semiconductor device according to the first embodiment of the present invention manufactured in the above-described manner is viewed from above, the N-channel MOS transistor and the P-channel MOS transistor are disposed in juxtaposition, as shown in FIG. 4. The N-channel MOS transistor is provided with the gate electrode 9a at the center and with the source region 11a and the drain region 12a at the both sides, respectively. Likewise, the P-channel MOS transistor is provided with the gate electrode 9b at the center and with the source region 11b and the drain region 12b at the both sides, respectively.

In this manner, in the present embodiment, the gate polysilicon film 6 in each of the gate electrodes 9a and 9b is formed of two laminated polycrystalline grain layers each comprising a substantially single crystal grain in a thickness direction of the film 6 as shown in FIG. 2. Therefore, since a grain boundary is formed in the gate electrode in its thickness direction, it is possible to prevent the ion from passing through the gate electrode without damaging the gate oxide film due to ion implantation during the ion implantation process at the time of formation of the source region and the drain region.

Figure 5:
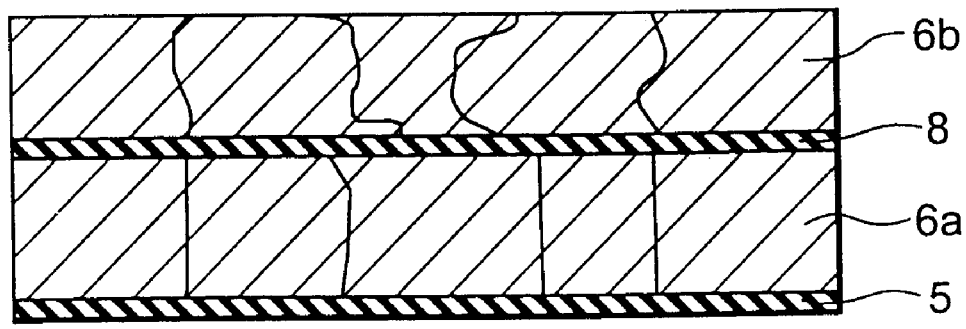
FIG. 5 is a sectional view showing a gate electrode of a semiconductor device according to a second embodiment of the present invention.

Next, a second embodiment of the present invention will be explained. FIG. 5 is a sectional view showing a gate electrode of a semiconductor device according to the second embodiment of the present invention. As shown in FIG. 5, in the gate electrode of the present embodiment, a gate polysilicon film 6a is formed on the gate oxide film 5, and a polysilicon oxide film 8 is formed on the gate polysilicon film 6a at a thickness of about 10 Å, for example. Furthermore, a polysilicon film 6b is formed on the polysilicon oxide film 8.

In the second embodiment also, the gate electrode is formed of two laminated polycrystalline grain layers each comprising a substantially single crystal grain in a thickness direction. Therefore, as in the first embodiment, it is possible to prevent the ion from passing through the gate electrode during the ion implantation process at the time of formation of the source region and the drain region.

Figure 6:
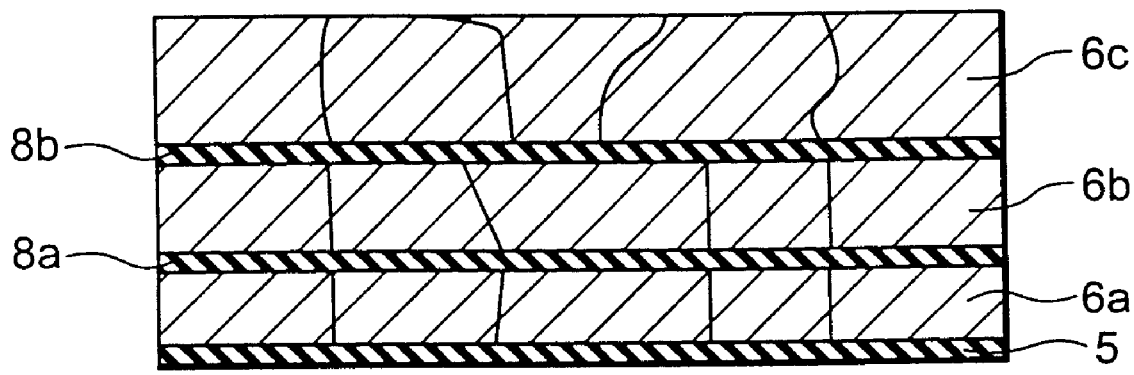
FIG. 6 is a sectional view showing a gate electrode of a semiconductor device according to a third embodiment of the present invention.

FIG. 6 is a sectional view showing a gate electrode of a semiconductor device according to a third embodiment of the present invention. In the gate electrode of the present embodiment, a polysilicon film 6a, a polysilicon oxide film 8a, a polysilicon film 6b, a polysilicon oxide film 8b and a polysilicon film 6c are laminated and formed on a gate oxide film 5 in this named order. Therefore, the gate electrode is formed of three laminated polycrystalline grain layers each comprising substantially single grain in a thickness direction. Therefore, two grain boundaries exist in the gate electrode in its thickness direction, and it is possible to further enhance the effect to prevent the ion from passing through the gate electrode.

The present invention is not limited to those embodiments, and a gate electrode can be formed of four or more laminated polycrystalline grain layers each comprising a substantially single grain in a thickness direction.

What is claimed is:
1. A MOS type semiconductor device, comprising
   a gate electrode, said gate electrode comprising a plurality of laminated polycrystalline silicon layers each having substantially single grain in a thickness direction of said gate electrode.
2. The MOS type semiconductor device according to claim 1, which further comprising a polysilicon oxide film formed between said polycrystal silicon layers.
3. A manufacturing method of a MOS type semiconductor device comprising the steps of:

forming a polysilicon film on a gate oxide film;

forming a polysilicon oxide film on said polysilicon film; and heating said polysilicon film to allow crystal grain in said polysilicon film to grow from said gate oxide film and said polysilicon oxide film and to make a plurality of laminated polycrystalline silicon layers each having substantially single grain in a thickness direction of said polysilicon film.

4. The manufacturing method of a MOS type semiconductor device according to claim 3, wherein said step of forming said polysilicon oxide film includes a step of annealing said polysilicon film in oxygen atmosphere.

5. The manufacturing method of a MOS type semiconductor device according to claim 3, wherein said step of heating said polysilicon film includes a step of annealing said polysilicon film in nitrogen atmosphere.

6. The manufacturing method of a MOS type semiconductor device according to claim 4, wherein said step of heating said polysilicon film includes a step of annealing said polysilicon film in nitrogen atmosphere.

7. A manufacturing method of a MOS type semiconductor device comprising the steps of;

forming (N+1) layers (N is a natural number) of polysilicon films and N layers of polysilicon oxide films on a gate oxide film such that said polysilicon films and said polysilicon oxide films are alternately laminated on one another; and heating said polysilicon films to allow crystal grain in said polysilicon films to grow from said gate oxide film and said polysilicon oxide films and to make a plurality of laminated polycrystalline silicon layers each having substantially single grain in a thickness direction of said polysilicon films.

* * * * *